United States Patent
Lee et al.

(10) Patent No.: US 9,816,172 B2
(45) Date of Patent: Nov. 14, 2017

(54) VACUUM POWERED DEPOSITION APPARATUS

(71) Applicant: Samsung Display Co., Ltd., Yongin, Gyeonggi-Do (KR)

(72) Inventors: Young-Uk Lee, Yongin (KR); Jeong-Won Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1077 days.

(21) Appl. No.: 14/010,407

(22) Filed: Aug. 26, 2013

(65) Prior Publication Data

US 2014/0260718 A1    Sep. 18, 2014

(30) Foreign Application Priority Data

Mar. 14, 2013    (KR) ........................ 10-2013-0027488

(51) Int. Cl.
    C23C 14/24    (2006.01)
    C23C 14/00    (2006.01)
    H01L 51/00    (2006.01)

(52) U.S. Cl.
    CPC ............ *C23C 14/00* (2013.01); *C23C 14/243* (2013.01); *C23C 14/24* (2013.01); *H01L 51/001* (2013.01); *Y10T 74/18056* (2015.01); *Y10T 74/18096* (2015.01)

(58) Field of Classification Search
    CPC ......... Y10T 74/18096; Y10T 74/18056; C23C 14/243
    USPC ........................ 74/25, 29, 30, 46, 48, 53, 55
    See application file for complete search history.

(56) References Cited

U.S. PATENT DOCUMENTS

| | | | | |
|---|---|---|---|---|
| 3,192,094 A | * | 6/1965 | Phillips | B29D 30/46 156/353 |
| 3,459,056 A | * | 8/1969 | Lea | F16H 35/00 74/29 |
| 3,746,571 A | * | 7/1973 | Little, Jr. | C23C 14/505 118/730 |
| 4,042,128 A | * | 8/1977 | Shrader | C23C 14/568 104/135 |
| 5,311,103 A | * | 5/1994 | Asmussen | C23C 16/505 118/723 R |
| 7,789,614 B2 | * | 9/2010 | Yoshino | H01L 21/67259 118/730 |

(Continued)

FOREIGN PATENT DOCUMENTS

| | | |
|---|---|---|
| CN | 102534529 A | 7/2012 |
| JP | 2004-225058 A | 8/2004 |

(Continued)

OTHER PUBLICATIONS

English Translation of JP 2004-225058.*

*Primary Examiner* — Gordon R Baldwin
*Assistant Examiner* — Aiden Lee
(74) *Attorney, Agent, or Firm* — Lewis Roca Rothgerber Christie LLP

(57) ABSTRACT

A vacuum powered deposition apparatus including a driving unit, a linear motion unit coupled to the driving unit and configured to move linearly according to operation of the driving unit, and an angle restriction unit coupled to the linear motion unit and configured to move in a direction perpendicular to that of the linear motion unit according to movement of the linear motion unit.

14 Claims, 3 Drawing Sheets

(56) References Cited

U.S. PATENT DOCUMENTS

| | | | | |
|---|---|---|---|---|
| 2001/0014268 A1* | 8/2001 | Bryson, III | ............ | C23C 14/566 414/217 |
| 2007/0116893 A1* | 5/2007 | Zwaap | ...................... | C23C 8/08 427/587 |
| 2008/0295771 A1* | 12/2008 | Chiang | ............. | H01J 37/32431 118/712 |
| 2010/0259162 A1 | 10/2010 | Moyama | | |

FOREIGN PATENT DOCUMENTS

| | | | | |
|---|---|---|---|---|
| JP | 2009-132977 A | 6/2009 | | |
| KR | 10-2005-0123425 A | 12/2005 | | |
| KR | WO 2012026790 A2 * | 3/2012 | ........... | F16H 25/183 |
| KR | 10-2012-0084863 A | 7/2012 | | |

* cited by examiner

VACUUM POWERED DEPOSITION APPARATUS

CROSS-REFERENCE TO RELATED APPLICATION

This application claims priority to and the benefit of Korean Patent Application No. 10-2013-0027488 filed in the Korean Intellectual Property Office on Mar. 14, 2013, the entire content of which is incorporated herein by reference.

BACKGROUND

1. Field

Embodiments of the present invention relate to a vacuum powered deposition apparatus.

2. Description of the Related Art

Mobile electronic devices are widely used, some examples of which include tablets and small electronic devices such as mobile phones. Such mobile electronic devices include a display unit for providing a user with visual information, such as still or moving images, to support various functions. Recently, as the size of components for operating the display unit has gotten smaller, the relative portion of the electronic device that a display unit occupies in the electronic device has gradually increased. Further, a structure for bending a display unit to have a certain angle in a flat state is also being developed.

Such a display unit may have an organic light-emitting device, and thus various images/letters may be shown as an organic light-emitting layer emits light using externally applied electric current. The organic light-emitting device may be formed in various methods. For example, the organic light-emitting device may be formed through, for example, an organic matter deposition method, a laser heat transfer method, a print screen method, etc. The organic matter deposition method is frequently used because an organic light-emitting device may be formed by a relatively simple process and at relatively inexpensive costs.

SUMMARY

Embodiments of the present invention provide a vacuum powered deposition apparatus for controlling a spray angle of deposition materials.

According to an aspect of the present invention, there is provided a vacuum powered deposition apparatus including a driving unit, a linear motion unit coupled to the driving unit and configured to move linearly according to operation of the driving unit, and an angle restriction unit coupled to the linear motion unit and configured to move in a direction perpendicular to that of the linear motion unit according to movement of the linear motion unit.

The driving unit may include a driving force generation unit configured to generate a driving force, and a rotation unit coupled to the driving force generation unit and configured to rotate.

The rotation unit may include a spur gear.

The linear motion unit may include a motion block coupled to the rotation unit and configured to move linearly when the rotation unit rotates.

The linear motion unit may include a guide unit configured to guide a part of the angle restriction unit when the angle restriction unit moves.

The guide unit may include a first guide, a second guide coupled at a first end to the first guide and extending diagonally from the first guide, and a third guide coupled to a second end of the second guide.

The first guide and the third guide may be vertically offset.

The guide unit may define holes having an oval shape.

The angle restriction unit may include an angle restriction plate between respective source units and configured to move linearly upward and downward, and a sliding unit coupled to the angle restriction plate and to the linear motion unit, and configured to slide in the direction perpendicular to that of the linear motion unit when the linear motion unit moves.

The angle restriction unit may further include a connector for coupling the angle restriction plate with the sliding unit.

The angle restriction unit may further include a blocking unit between the angle restriction plate and the sliding unit, and may be configured to close a groove at a side shield.

The vacuum powered deposition apparatus may further include a fixing unit configured to enable the angle restriction unit to slide.

The vacuum powered deposition apparatus may further include a linear guide unit between the fixing unit and the sliding unit, and configured to guide the sliding unit.

The vacuum powered deposition apparatus may further include an auxiliary guide unit facing the linear motion unit and configured to guide the linear motion unit.

The auxiliary guide unit may include a fixing bracket, and a guide at an external surface of the fixing bracket, and configured to guide the linear motion unit.

The vacuum powered deposition apparatus may further include a reinforcement rib at the external surface of the fixing bracket.

The linear motion unit may include a projection unit inserted into the guide.

The vacuum powered deposition apparatus may further include an indication unit configured to indicate a location of the angle restriction unit.

The indication unit may include a motion unit at the angle restriction unit and configured to move with the angle restriction unit, and a location display unit fixed at an external side and configured to indicate a location of the motion unit.

The vacuum powered deposition apparatus may further include a cover unit for covering the driving unit and a part of the linear motion unit.

BRIEF DESCRIPTION OF THE DRAWINGS

The above and other aspects of embodiments of the present invention will become more apparent by describing in detail exemplary embodiments thereof with reference to the attached drawings in which.

DETAILED DESCRIPTION

Embodiments of the present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. In the present description, a singular form may also include a plural form. Terms such as "including", "having", or "consisting of" may be intended to indicate a plurality of components unless the terms are used with the term "only." Terms such as "first" and "second" may be used to describe various components, but such terms are used only to distinguish one component from another, and the components are not limited by such terms.

Figure 1:
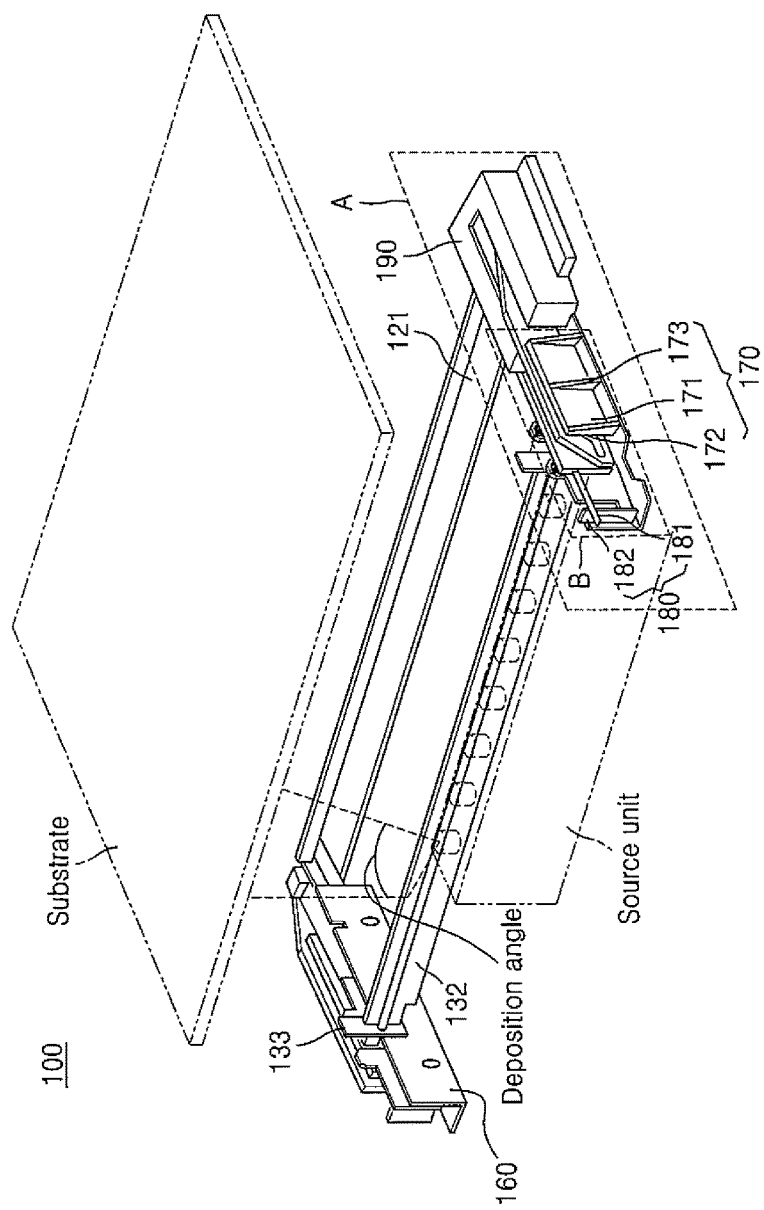
FIG. 1 is a perspective view showing a vacuum powered deposition apparatus according to an exemplary embodiment of the present invention in a first configuration.
Figure 2:
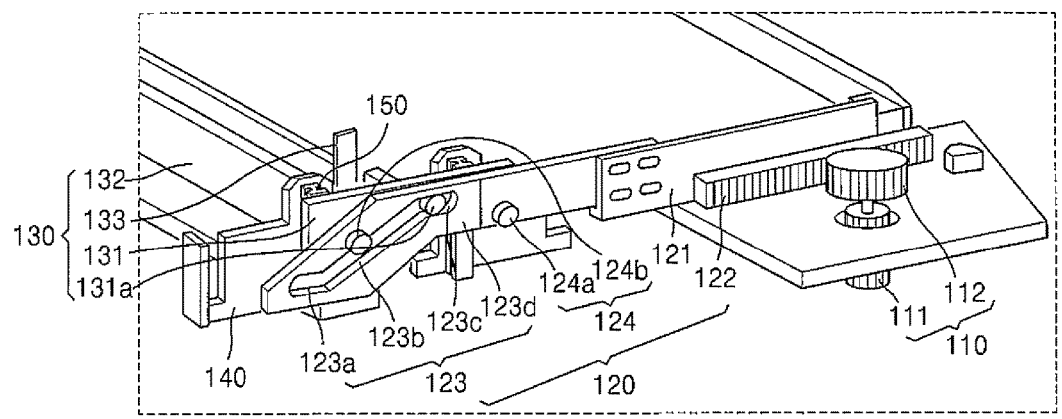
FIG. 2 is an enlarged partial perspective view showing the region A of FIG. 1.
Figure 3:
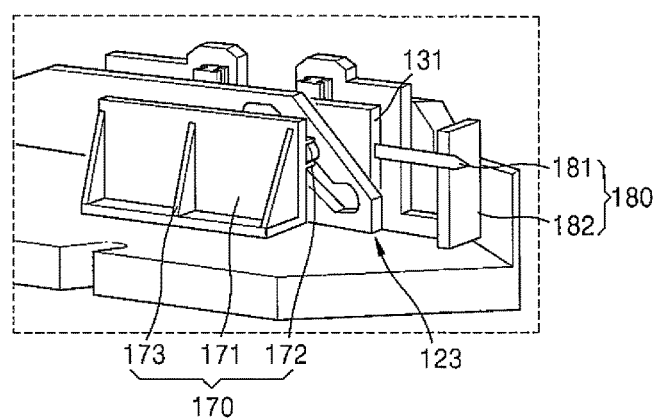
FIG. 3 is an enlarged partial perspective view showing the region B of FIG. 1.
Figure 4:
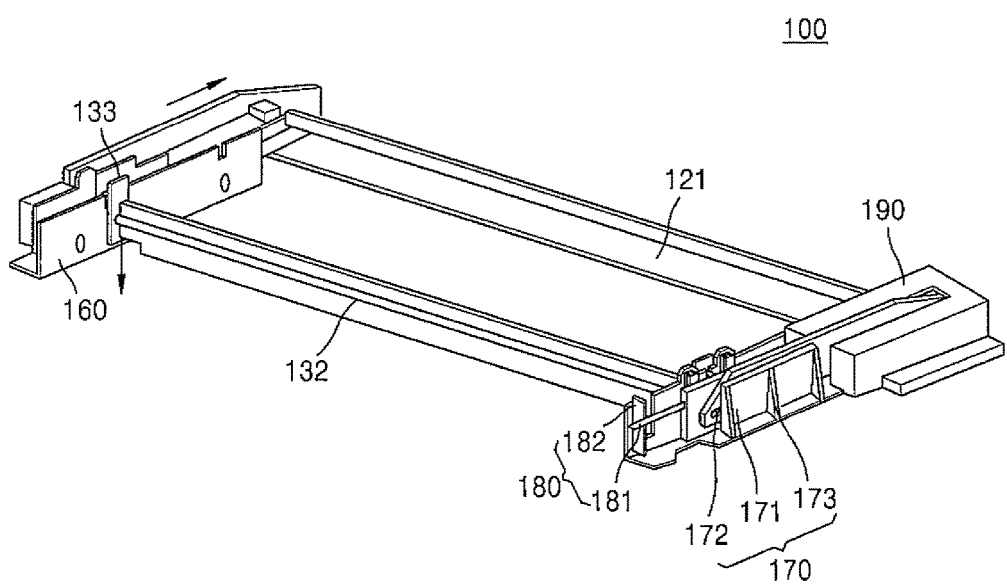
FIG. 4 is a perspective view showing the vacuum powered deposition apparatus according to the exemplary embodiment shown in FIG. 1 in a second configuration.

FIG. 1 is a perspective view showing a vacuum powered deposition apparatus 100 according to an exemplary embodiment of the present invention in a first configuration. FIG. 2 is an enlarged partial perspective view showing the region A of FIG. 1. FIG. 3 is an enlarged partial perspective view showing the region B of FIG. 1. FIG. 4 is a perspective view showing the vacuum powered deposition apparatus according to the exemplary embodiment shown in FIG. 1 in a second configuration.

Referring to FIGS. 1 to 4, the vacuum powered deposition apparatus 100 may include a chamber where a space is formed. Also, the vacuum powered deposition apparatus 100 may be installed inside a chamber, and may include source units to deposit materials such as organic matter. Also, the vacuum powered deposition apparatus 100 may include a source unit fixing frame installed to fix the source unit.

Furthermore, referring to FIG. 2, the vacuum powered deposition apparatus 100 may include a driving unit 110, and a linear motion unit 120 coupled to the driving unit 110 and configured to linearly move according to operation of the driving unit 110. Also, the vacuum powered deposition apparatus 100 may include an angle restriction unit 130 that is coupled to the linear motion unit 120 and that is configured to move vertically according to the movement of the linear motion unit 120. In this regard, the vacuum powered deposition apparatus 100 may also include a fixing unit 140 installed such that the angle restriction unit 130 may slide. The vacuum powered deposition apparatus 100 may also include a side shield 160.

Furthermore, the driving unit 110 may include a driving force generation unit 111 that generates or otherwise provides a driving force. In particular, the driving force generation unit 111 may include a motor, although the driving force generation unit 111 is not limited thereto, and may include other devices that generate a driving force.

The driving unit 110 may include a rotation unit 112 that is coupled to the driving force generation unit 111, and that may be rotated. In this regard, the rotation unit 112 may be a spur gear, although the rotation unit 112 is not limited thereto, and may include other devices that transmit driving force according to the operation of the driving force generation unit 111.

Furthermore, the linear motion unit 120 may include a source shield 121 that moves linearly according to the movement of the driving unit 110. Also, the linear motion unit 120 may be coupled to the rotation unit 112, and may include a motion block 122 that moves linearly according to the movement of the rotation unit 112. In this regard, when the rotation unit 112 is a spur gear, the motion block 122 may be a rack gear that engages the spur gear and moves when the spur gear rotates. However, the motion block 122 is not limited thereto, and may include other devices and structures that move linearly at the time of the rotational movement of the rotation unit 112.

The linear motion unit 120 may include a guide unit 123 that guides a part of the angle restriction unit 130 when the angle restriction unit 130 moves. In this regard, the guide unit 123 may include a guide body 123d. In particular, the guide body 123d may be plate shaped, and a part of the guide body 123d may be bent.

Furthermore, the guide unit 123 may include first, second, and third guides 123a, 123b, and 123c formed at, or defined by, the guide body 123d. The first guide 123a may be coupled to the second guide 123b, and the first and second guides 123a and 123b may form a certain angle. Similarly, the third guide 123c may be coupled to the second guide 123b.

The first, second, and third guides 123a, 123b, and 123c may take various forms. For example, the first, second, and third guides 123a, 123b, and 123c may be grooves or holes. Also, the first, second, and third guides 123a, 123b, and 123c may be formed as a projection that corresponds to a hole or groove. However, in the present embodiment, the first, second, and third guides 123a, 123b, and 123c are hole/groove shaped.

The groove may be oval-like. In this regard, the first guide 123a and the third guide 123c may be formed at locations with different heights, and the second guide 123b may extend in a diagonal direction to couple the first guide 123a with the third guide unit 123c.

Additionally, the linear motion unit 120 may include a projection unit 124 installed at, or in, the guide unit 123. In this regard, the projection unit 124 projects from the guide body 123d, and may maintain the path of the guide body 123d when the guide body 123d moves. In particular, the projection unit 124 may include a plurality of projections, namely, a first projection 124a and a second projection 124b. The first projection 124a and the second projection 124b may be formed in a bearing shape, and may reduce or minimize frictional force by a contact with an auxiliary guide unit 170 (see FIGS. 1 and 3) at the time of the movement of the guide body 123d.

Furthermore, the angle restriction unit 130 may be installed between respective source units, and may include an angle restriction plate 132 that moves linearly in a vertical direction. Furthermore, the angle restriction unit 130 may be coupled with the angle restriction plate 132 and the linear motion unit 120, and may include a sliding unit 131 that slides perpendicularly to the movement direction of the linear motion unit 120. In this regard, the sliding unit 131 may be coupled to the angle restriction plate 132 through a connector.

Furthermore, the sliding unit 131 may be coupled to the guide unit 123 and may slide perpendicularly to the movement direction of the guide unit 123, as described above. Specifically, the sliding unit 131 may include an insertion projection 131a that may be inserted into the groove that is the first, second, and third guides 123a, 123b, and 123c. In the present embodiment, the insertion projection 131a may be formed in a bearing shape.

The sliding unit 131 may slide with respect to the fixing unit 140. In other embodiments of the present invention, a plurality of fixing units may be provided, and may be arranged and fixed at regular intervals.

Furthermore, a linear guide unit 150 (see FIG. 2) may be installed between the sliding unit 131 and the fixing unit 140 to guide the movement of the sliding unit 131. In the present embodiment, the linear guide unit 150 may include a general linear motion (LM) guide. In other embodiments, a plurality of linear guide units 150 may be provided, and may be respectively installed at the fixing units 140 to couple each fixing unit 140 with the sliding unit 131.

The above-described side shield 160 may installed inside the fixing unit 140. In this regard, a groove may be formed in the side shield 160, and the connector may be inserted into the groove. In particular, the angle restriction unit 130 may include a blocking unit 133 installed between the angle restriction plate 132 and the side shield 160 to close the groove formed in the side shield 160. In this regard, the blocking unit 133 may extend in a direction perpendicular to the longitudinal direction of the connector.

Furthermore, the vacuum powered deposition apparatus 100 may be installed to face the linear motion unit 120, and may include the auxiliary guide unit 170 that guides movement of the linear motion unit 120. In particular, the auxiliary guide unit 170 may be arranged outside the guide unit 123 to guide the movement of the guide unit 123.

In this regard, the auxiliary guide unit 170 may include an externally fixed fixing bracket 171. Also, the auxiliary guide unit 170 may be formed at the fixing bracket 171, and may include a guide 172 that guides the movement of the guide unit 123.

In particular, the guide 172 may be formed at an external surface of the fixing bracket 171 so that a part of the guide unit 123 may be inserted. Specifically, the guide 172 may be a groove or a hole so that a part of the linear motion unit 120 may be inserted into the guide 172. Furthermore, the guide 172 may be a projection so that a part of the linear motion unit 120 may be inserted into the guide 172. In particular, when the guide 172 is a projection, the guide 172 may be formed as a pair of projections so that a part of the linear motion unit 120 may be inserted into a space between the pair of projections of the guide 172. In this regard, the guide 172 is not limited thereto, and may include various structures and devices that guide the movement of the linear motion unit 120. However, the guide 172 of the present embodiment is formed as a pair of projections.

In this regard, the first projection 124*a* and the second projection 124*b* (see FIG. 2) may be inserted into the guide 172, and may move linearly. Also, the first projection 124*a* and the second projection unit 124*b* may maintain the linear movement path of the guide unit 123 while moving along the guide 172.

The auxiliary guide unit 170 may include a reinforcement rib 173 formed at the external surface of the fixing bracket 171. In this regard, a plurality of reinforcement ribs 173 may be formed, and the plurality of reinforcement ribs 173 may be formed on the external surface of the fixing bracket 171 at regular intervals.

Furthermore, when the angle restriction unit 130 linearly moves in a vertical direction, the vacuum powered deposition apparatus 100 may include an indication unit 180 that indicates the location (e.g., a vertical location, or a height) of the angle restriction unit 130. The indication unit 180 may be installed at the angle restriction unit 130, and may include a motion unit 181 that moves with the angle restriction unit 130 when the angle restriction unit 130 linearly moves in a vertical direction. Furthermore, the indication unit 180 may include a location display unit 182 that is externally fixed and displays the location of the motion unit 181.

The motion unit 181 may be installed to be fixed at the sliding unit 131. Furthermore, gradations for displaying the height of the motion unit 181 may be formed at the location display unit 182, and thus the height of the motion unit 181 may be determined via its proximity to the gradations of the location display unit 182.

The vacuum powered deposition apparatus 100 may include a cover unit 190 formed to cover parts of the driving unit 110 and the linear motion unit 120. For example, the cover unit 190 may cover the source shield 121, the driving force generation unit 111, and the rotation unit 112, and may prevent pollution/contamination of the source shield 121, the driving force generation unit 111, and the rotation unit 112 by deposition materials.

Furthermore, when the vacuum powered deposition apparatus 100 is operated, deposition materials from the source unit(s) may be heated and deposited, and thus, the deposition process may be performed on a substrate. In this regard, a plurality of source units may be provided, and the angle restriction plate 132 may be installed between the plurality of source units as described above.

A preset height of the angle restriction plate 132 may be regulated according to the stage/progress level of the deposition process. Specifically, the driving unit 110 may be operated according to the preset height. In this regard, the rotation unit 112 may be rotated by operation of the driving force generation unit 111.

The rotation unit 112 may control the motion block 122 coupled with the rotation unit 112 to move linearly in one direction by rotating the rotation unit 112. Likewise, when the motion block 122 moves, the source shield 121 coupled with the motion block 122 may also move in the same direction as that of the motion block 122.

In detail, if the rotation unit 112 is rotated in a counter-clockwise direction, it may cause the motion block 122 to move forward, and the source shield 121 may also move forward with the motion block 122. Likewise, when the source shield 121 moves forward, the guide unit 123 may also move forward along with the source shield 121.

Furthermore, when the guide unit 123 moves forward, the first projection 124*a* and the second projection 124*b* may move along the guide 172. That is, the first projection 124*a* and the second projection 124*b* may have their movement restricted by the guide 172, and thus deviation of the guide unit 123 from an intended path may be prevented.

Likewise, when the guide unit 123 is moved, the insertion projection 131*a* may move from the first guide 123*a* to the third guide 123*c*. In detail, the insertion projection 131*a* may move along from the first guide 123*a* to the second guide 123*b*, and may then move along the third guide 123*c*. In the present embodiment, in moving to the third guide 123*c*, the height of the insertion projection 131*a* increases. That is, the height of the insertion projection 131*a* may gradually increase as the insertion projection 131 moves from the first guide 123*a* to the third guide 123*c*.

Likewise, when the insertion projection 131*a* moves in the groove defined by the first, second, and third guides 123*a*, 123*b*, and 123*c*, the sliding unit 131 may also linearly move upward. In this regard, the linear guide unit 150 may guide the movement of the sliding unit 131, and may prevent deviation of the sliding unit 131 from an intended moving path.

Likewise, when the sliding unit 131 moves, the connector, the blocking unit 133, and the angle restriction plate 132 may also move with the sliding unit 131. Thus, the angle restriction plate 132 may move upward, and the deposition angle of deposition materials sprayed from the source unit may decrease due to proximity of the substrate to the source unit.

Likewise, when the angle restriction plate 132 moves upward, the groove in the side shield 160 may be opened. In this regard, the blocking unit 133 may close the groove as the blocking unit 133 moves upward with the angle restriction plate 132. In particular, the height of the blocking unit 133 may be higher than the angle restriction plate 132, and thus, even when the angle restriction plate 132 moves upward, the groove may be completely closed.

Furthermore, when the angle restriction plate 132 moves downward, the opposite operation of the above operation may be performed. In detail, if the driving force generation unit 111 is operated in reverse to the above operation, the rotation unit 112 may rotate in a clockwise direction.

The motion block 122 may move backward due to the clockwise rotation of the rotation unit 112, and the motion block 122 may move backward with the source shield 121, and the source shield 121 may cause the guide unit 123 to move back.

When the guide unit 123 moves backward, the first projection 124a and the second projection 124b may move linearly along the guide 172. Also, the insertion projection 131a may move from the third guide 123c to the first guide 123a. That is, the insertion projection 131a may sequentially move downward along the second guide 123b from the third guide 123c, and then along the first guide 123a from the second guide 123b.

If the insertion projection 131a moves downward as described above, the sliding unit 131 will move downward along with the insertion projection 131a. In this regard, the linear guide unit 150 may prevent separation of the sliding unit 131 from the fixing unit 140 while guiding the movement of the sliding unit 131. When the sliding unit 131 moves as described above, the connector, the blocking unit 133, and the angle restriction plate 132 may move downward along with the sliding unit 131. In this regard, the blocking unit 133 may prevent an outflow of deposition materials by completely closing the groove of the side shield 160 as described above.

Furthermore, when the angle restriction plate 132 moves upward or downward, the height of the angle restriction plate 132 may be measured by the indication unit 180, which may be installed to be observed externally by a person through a window of the chamber.

In particular, when the sliding unit 131 moves upward or downward as described above, the motion unit 181 may move with the sliding unit 131. In this regard, the motion unit 181 may be arranged on one side of the location display unit 182, and thus the measurement of the location display unit 182, which corresponds to the position of the motion unit 181, may be observed. For example, a worker, etc. may determine whether the location of the angle restriction plate 132 is accurate by checking the location of the motion unit 181 according to the preset location of the angle restriction plate 132.

According to exemplary embodiments of the present invention, time and cost associated with the replacement of an angle restriction plate for different processes may be reduced by automatically changing the height of the angle restriction plate between source units. According to the present embodiment of the present invention, a chamber need not be opened for replacement of the angle restriction plate, and thus the vacuum state of the chamber may be continually maintained. Furthermore, according to the exemplary embodiments of the present invention, consecutive deposition may be performed, and thus the rate of operation of a facility may be enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. An apparatus for restricting a deposition angle of deposition materials, the apparatus comprising:
   a driving unit;
   a linear motion unit coupled to the driving unit, the linear motion unit configured to move linearly in a first direction according to operation of the driving unit, and comprising a plurality of projection units projecting from the linear motion unit;
   an angle restriction unit coupled to the linear motion unit and configured to adjust the deposition angle of deposition materials sprayed from a deposition source unit by moving in a vertical direction, which comprises a component of direction that is perpendicular to the first direction of the linear motion unit, according to movement of the linear motion unit;
   an auxiliary guide unit comprising a guide at least partially surrounding the projection units, and configured to guide movement of the linear motion unit in the first direction;
   a fixing unit configured to enable the angle restriction unit to slide; and
   a side shield configured to be disposed inside the fixing unit,
   wherein the linear motion unit comprises a guide unit configured to guide a part of the angle restriction unit when the angle restriction unit moves, the guide unit comprising:
   a first guide;
   a second guide comprising a first end coupled to the first guide and extending diagonally from the first guide; and
   a third guide coupled to a second end of the second guide and vertically offset from the first guide.

2. The apparatus of claim 1, wherein the driving unit comprises:
   a driving force generation unit configured to generate a driving force; and
   a rotation unit coupled to the driving force generation unit and configured to rotate.

3. The apparatus of claim 2, wherein the rotation unit comprises a spur gear.

4. The apparatus of claim 2, wherein the linear motion unit comprises a motion block coupled to the rotation unit and configured to move linearly when the rotation unit rotates.

5. The apparatus of claim 1, wherein the guide unit defines holes having an oval shape.

6. The apparatus of claim 1, wherein the angle restriction unit of claim 1 comprises:
   an angle restriction plate configured to move linearly upward and downward; and
   a sliding unit coupled to the angle restriction plate and to the linear motion unit, and configured to slide to thereby move in the vertical direction that comprises the component of direction that is perpendicular to the first direction of the linear motion unit when the linear motion unit moves.

7. The apparatus of claim 6, wherein the angle restriction unit further comprises a blocking unit between the angle restriction plate and the sliding unit.

8. The apparatus of claim 6, further comprising a linear guide unit between the fixing unit and the sliding unit, and configured to guide the sliding unit.

9. The apparatus of claim 1, wherein the auxiliary guide unit faces the linear motion unit.

10. The apparatus of claim 9, wherein the auxiliary guide unit comprises:
 a fixing bracket; and
 the guide at an external surface of the fixing bracket.

11. The apparatus of claim 10, further comprising a reinforcement rib at the external surface of the fixing bracket.

12. The apparatus of claim 1, further comprising an indication unit configured to indicate a location of the angle restriction unit.

13. The apparatus of claim 12, wherein the indication unit comprises:
 a motion unit at the angle restriction unit and configured to move with the angle restriction unit; and
 a location display unit fixed at an external side and configured to indicate a location of the motion unit.

14. The apparatus of claim 1, further comprising a cover unit for covering the driving unit and a part of the linear motion unit.

\* \* \* \* \*